(12) United States Patent
Schaef et al.

(10) Patent No.: US 10,720,831 B2
(45) Date of Patent: Jul. 21, 2020

(54) REFERENCE VOLTAGE GENERATION

(71) Applicant: INTEL CORPORATION, Santa Clara, CA (US)

(72) Inventors: Christopher Schaef, Hillsboro, OR (US); Vaibhav Vaidya, Portland, OR (US); Suhwan Kim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 15/855,683

(22) Filed: Dec. 27, 2017

(65) Prior Publication Data

US 2019/0199206 A1    Jun. 27, 2019

(51) Int. Cl.
*H02M 3/07* (2006.01)
*H02M 3/28* (2006.01)
*H03K 3/011* (2006.01)
*H03B 5/04* (2006.01)

(52) U.S. Cl.
CPC ............... *H02M 3/07* (2013.01); *H02M 3/28* (2013.01); *H03B 5/04* (2013.01); *H03K 3/011* (2013.01)

(58) Field of Classification Search
CPC ............ H02M 3/00; H02M 3/02; H02M 3/04; H02M 3/06; H02M 3/07; H02M 3/073; H02M 3/22; H02M 3/24; H02M 3/28; H02M 3/285; H02M 2003/071; H02M 2003/072; H02M 2003/075; H02M 2003/076; H02M 2003/077; H02M 2003/078; H03B 5/04; H03K 3/011
See application file for complete search history.

(56) References Cited

U.S. PATENT DOCUMENTS

| 7,971,076 B2 | 6/2011 | Barrenscheen et al. |
| 2012/0030488 A1 | 2/2012 | Fung et al. |
| 2014/0070976 A1* | 3/2014 | Hurrell .................. G11C 27/02 341/172 |
| 2014/0226398 A1* | 8/2014 | Desireddi .......... G11C 16/3436 365/185.03 |
| 2015/0069985 A1 | 3/2015 | Wilson |

FOREIGN PATENT DOCUMENTS

| WO | 2005-006161 A2 | 1/2005 |
| WO | 2016094320 A1 | 6/2016 |

OTHER PUBLICATIONS

International Search Report for Related PCT Application PCT/US2018/062756 dated Mar. 14, 2019, 5 pages.

* cited by examiner

*Primary Examiner* — Lincoln D Donovan
*Assistant Examiner* — Diana J. Cheng
(74) *Attorney, Agent, or Firm* — International IP Law Group, P.L.L.C.

(57) ABSTRACT

In some examples, an apparatus for reference voltage generation includes a plurality of reference voltage rails each with a corresponding reference voltage, a first controller, and a second controller. The first controller is to cycle through the plurality of reference voltage rails and maintain the reference voltages in a synchronous mode. The second controller is to detect an event and provide an indication to the first controller to update in an asynchronous mode one of the plurality of reference voltages in response to the event. The first controller is to update in an asynchronous mode the one of the plurality of reference voltages in response to the event.

44 Claims, 6 Drawing Sheets

400

500

REFERENCE VOLTAGE GENERATION

TECHNICAL FIELD

This disclosure relates generally to reference voltage generation.

BACKGROUND

Many computing systems (for example, portable or mobile systems) need to maintain a low power consumption. For example, net-zero energy computing devices, wearable devices, or internet of things (IoT) devices, among others, require low power consumption. Net-zero energy computing devices are experiencing a paradigm shift toward extremely low power consumption. In particular, reduction of standby power can be an important goal since some devices may spend most of their time in a standby mode. In order to maintain a low overhead, it is key for some devices to transition very quickly between low power standby modes and active modes. However, some circuits (for example, some analog circuits) that are designed for very low power consumption may exhibit low speeds. Reference voltage generators that define reference voltages for multiple supply rails of an integrated circuit (IC) such as an SoC (system on a chip) can exhibit low speeds. Reference voltages may need to be maintained with very low power consumption while in a standby state, but may also need to quickly change (for example, when an SoC transitions to an active state and requires higher supply voltages).

BRIEF DESCRIPTION OF THE DRAWINGS

The following detailed description may be better understood by referencing the accompanying drawings, which contain specific examples of numerous features of the disclosed subject matter.

In some cases, the same numbers are used throughout the disclosure and the figures to reference like components and features. In some cases, numbers in the 100 series refer to features originally found in FIG. 1; numbers in the 200 series refer to features originally found in FIG. 2; and so on.

DESCRIPTION OF THE EMBODIMENTS

Figure 1:
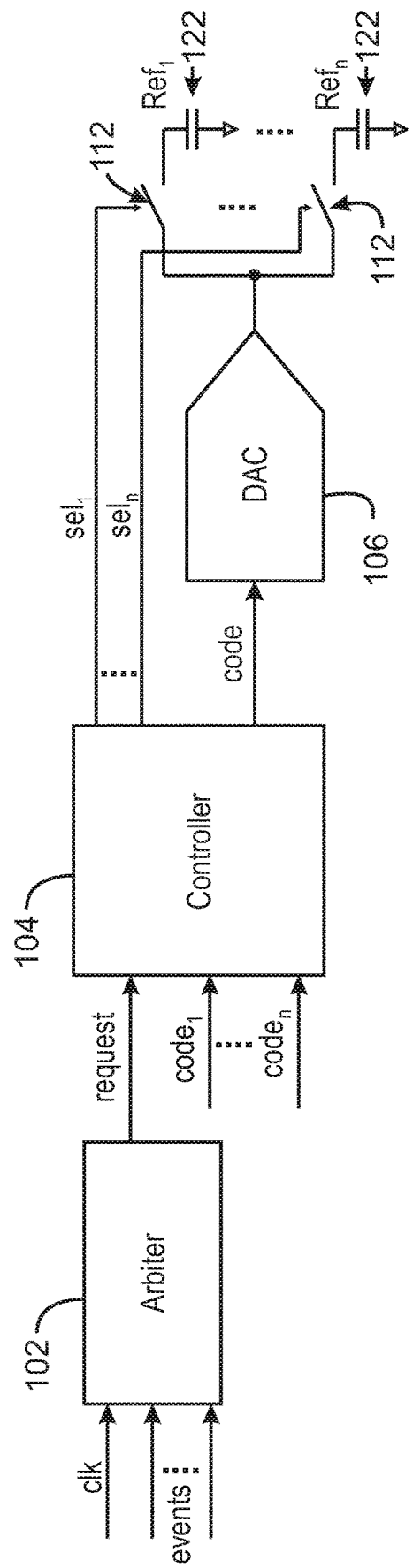
FIG. 1 illustrates a reference voltage generator.

Some embodiments relate to reference voltage generation. Some embodiments relate to reference voltage generation with low power consumption.

As discussed above, many computing systems (for example, portable or mobile systems) need to maintain a low power consumption. For example, net-zero energy computing devices, wearable devices, or internet of things (IoT) devices, among others, require low power consumption. Net-zero energy computing devices are experiencing a paradigm shift toward extremely low power consumption, and reduction of standby power can be an important goal since these types of devices may spend most of their time in a standby mode. In order to maintain a low overhead, it is important for devices to transition between low power standby modes and active modes very quickly. Reference voltages may need to be maintained with very low power consumption while in a standby state, but may also need to quickly change.

In a system (for example, a large system) that needs many reference voltages, there are different options that can be used for generating the reference voltages. There are tradeoffs in area and power of the various options that may be used for generating the reference voltages. In order to save area and power, for example, a single digital to analog converter (DAC) can be used to generate the reference voltages. If a single DAC is used to generate the reference voltages, however, there could sometimes be a reduction in speed as the DAC samples the various rails in generating the reference voltages, for example, as the DAC cycles through the various rails in a fixed synchronous sequence. In some embodiments, one of the voltage rails may need a fast update due to an event occurring that requires an update of that particular voltage rail, and the update can be implemented quickly. In some embodiments, such an event is detected and a normal cycle sequence between all of the voltage rails is interrupted. The sequence then jumps immediately to the rail that needs fast updating. Additionally, in some embodiments, if two or more rails need quick updating around the same time, the sequence can be controlled to move from one of those rails to another so that rails needing immediate updating are prioritized over the normal cycling operation between voltage rails. Once all voltage rails needing fast updating are prioritized and updated, sequencing of the rails can be returned to the normal cycle sequence alternating between the various voltage rails.

In some embodiments, in a synchronous mode of a voltage reference generator, sequencing of the voltage rails is cycled between the various voltage rails. In some embodiments, is an event occurs that requires a quick updating of one of the voltage rails, the voltage reference generator immediately moves to an asynchronous mode where one or more voltage rails can be prioritized and immediately updated. In some embodiments, when there are no longer any events requiring a quick updating of any of the voltage rails, the voltage generator can move back to the synchronous mode in which sequencing of the voltage rails is returned to the normal cycle sequence alternating between the various voltage rails.

One example of an asynchronous event that might occur for the system to bypass the normal synchronous order of the voltage rails according to some embodiments might include an event for which the system or a device in the system (for example, a computing device such as a processor) might be a state change requiring a different voltage than what the current rails are providing. In response to such an event, one of the voltage rails can be selected, and the voltage being provided by that rail can be changed from one voltage to another based on needs of the system. In some embodiments, when an event such as a state change of a system or of a device in the system occurs, it can be important to change the voltage being provided by a voltage rail as quickly as possible. In this manner, a device such as a compute part of the system does not have to wait long before performing additional tasks, for example. In some embodiments, the signal indicating such an asynchronous event can be received from a unit in the system such as a power management unit.

Some embodiments relate to a multiple output sampled reference generator (for example, reference voltage generator) that includes a synchronous mode and an asynchronous mode. In some embodiments, a reference voltage generator includes a synchronous mode and an asynchronous mode, and can achieve low power consumption and fast transitions.

Some embodiments relate to a reference voltage generator that uses both a synchronous interface and an asynchronous interface. When output voltage references are being maintained, the reference voltages can be continuously sampled at a particular frequency (for example, a clock frequency $f_{clk}$). When a fast response to a reference voltage transition is needed, an asynchronous interface can create an event clock and the reference voltage generator can quickly respond (for example, without waiting for the clock to sample the appropriate voltage rail). The asynchronous mode can be activated when certain events are detected (for example, a change in a digital code for one of the reference voltage rails, or enabling of a voltage rail, etc.) In some embodiments, the asynchronous mode can be fully asynchronous. In some embodiments, the asynchronous mode can be based on a clock that is different than a digital-to-analog converter (DAC) sampling clock (for example, in some embodiments, a watchdog based clock).

In some embodiments, a speed of a digital-to-analog converter (DAC) can be increased during asynchronous events. For example, a speed of a DAC can be increased by increasing bias currents of analog circuits coupled to the DAC. In some embodiments, a reference voltage generator can offer fast transitions without continuously requiring a high clock frequency. In this manner, power consumption can be significantly reduced.

FIG. 1 illustrates a reference voltage generator 100 in accordance with some embodiments. In some embodiments, reference voltage generator 100 can be included in a power management device such as a power management integrated circuit (IC). In some embodiments, reference voltage generator 100 can be implemented in hardware. In some embodiments, reference voltage generator 100 can be implemented in a combination of hardware and software. Reference voltage generator 100 includes an arbiter 102, a controller 104, a digital-to-analog converter (DAC) 106, a plurality of switches 112, and a plurality of voltage rails 122 each including a capacitor that can be used to hold a plurality of n different reference voltages $Ref_1$, $Ref_2$, . . . $Ref_n$. The number of voltage rails 122 can be any number, depending on system requirements (for example, based on the number of different reference voltages that the system being supplied by the reference voltage generator 100 might need). In some embodiments, some or all of the functionality of the arbiter 102 can be implemented in hardware, in software, or in a combination of hardware and software. In some embodiments, some or all of the functionality of the controller 104 can be implemented in hardware, in software, or in a combination of hardware and software.

In some embodiments, FIG. 1 illustrates a high level block diagram of a multi-output reference generator for n output reference voltages. Controller 104 can be a digital controller that uses a different digital voltage code ($Code_1$, $Code_2$, . . . $Code_n$) for each reference output $Ref_1$, $Ref_2$, . . . $Ref_n$. The digital voltage codes ($Code_1$, $Code_2$, . . . $Code_n$) can be a digital representation defining a voltage to be provided by the respective voltage rail 122 associated with the code. When controller 104 selects a specific reference voltage rail, it passes a corresponding voltage code (Code) to the DAC 106, and also enables the corresponding appropriate switch 112 using corresponding select signals $sel_1$, $sel_2$, . . . $sel_n$. DAC 106 receives the digital voltage code (Code) and provides a corresponding analog voltage that is then provided to the corresponding voltage rail 122 via the corresponding select signal $sel_1$, $sel_2$, . . . $sel_n$ switching (enabling) the corresponding switch 112. In a synchronous mode of reference voltage generator 100, controller 104 cycles through the reference voltage rails 122 by cycling through the digital codes ($Code_1$, $Code_2$, . . . $Code_n$) provided to DAC 106, while simultaneously cycling through the corresponding select signals ($sel_1$, $sel_2$, . . . $sel_n$) based on the input clock signal (clk). In some embodiments, in a synchronous mode of reference voltage generator 100, controller 104 controls cycling through the voltage rails 122 at a slow rate to maintain the reference voltage outputs and avoid leakage or drift. For example, the input clock signal (clk) can be a moderate frequency input clock signal in some embodiments. In some embodiments, for example, input clock signal is not a high frequency clock signal.

Event signals (events) indicating an event can be received from a unit in the system that includes reference voltage generator 100, such as, for example, a power management unit that includes reference voltage generator 100 or a power management unit that does not include reference voltage generator 100. In some embodiments, the event signals (events) are provided as inputs to arbiter 102. In some embodiments, arbiter 102 is used to arbitrate when more than one event occurs at the same time or in close succession. Therefore, in some embodiments, arbiter 102 is used to arbitrate servicing of an event, and precluding servicing of another event until servicing of the event is completed.

Arbiter 102 can provide arbitration in an asynchronous mode of reference voltage generator 100 according to some embodiments. Arbiter 102 can send requests (for example, via a request signal) to the controller 104 based on asynchronous events as well as regular requests based on the input clock signal (clk). Arbiter 102 manages the order of processing of events. According to some embodiments, arbiter 102 makes sure that generator 100 does not try to process two events at the same time. That is, for example, if the DAC 106 takes a short amount of time to change a reference voltage, the arbiter ensures that once a request to process an event is sent from arbiter 102 to controller 104, the arbiter 102 makes sure that the generator 100 waits long enough (for example, a fixed amount of time) to make sure that the DAC 106 has settled before the next event request can be sent or before the generator 100 switches back to synchronous mode and cycles through the voltage rails. In some embodiments, if two codes change at the same time, the arbiter 102 decides which voltage rail 122 is changed first and sends a request to the controller 104 for that first rail. In some embodiments, the arbiter 102 then waits a predetermined amount of time before sending a request for a voltage change on the second rail. It is noted that in some embodiments, the request signal sent from arbiter 102 to the controller 104 can be more than a one bit signal. For example, it can include information about which voltage rail (and associated digital voltage code) corresponds to the request.

For example, in some embodiments, in order to change a reference voltage in response to an event, controller 104 provides the new digital code associated with the desired voltage to the DAC 106. DAC 106 converts the new digital code to the corresponding analog voltage, and samples that voltage onto the capacitor of the voltage rail associated with the event. When a reference voltage is changed on one of the reference voltage rails 122, the voltage of that rail stored in the capacitor remains at the new voltage level until changed. The new voltage can be maintained as the voltage generator 100 operates in synchronous mode after the change.

In some embodiments, an event can be detected if one of the codes (digital codes $Code_1$, $Code_2$, ... $Code_n$) has changed, for example. Each rail 122 may have several event indicators (for example, a change in reference voltage, rail enabling, or other event indicators). If an event is detected, a request is sent from arbiter 102 to controller 104 that indicates which rail is associated with the event. If more than one event is detected (for example, at the same time or around the same time), a series of requests can be output sequentially by the arbiter 102 until all requests are processed by the controller 104. The duration of each request can be based on a speed of the digital-to-analog converter 106. In some embodiments, a high speed mode of digital-to-analog converter 106 can be enabled during certain events (or certain types of events) in order to accelerate processing of asynchronous requests.

In some embodiments of reference generator 100, a separate monitoring device (not illustrated in FIG. 1) can monitor each of the codes ($Code_1$, $Code_2$, ... $Code_n$) to determine if one of the digital codes changes. If the monitoring device determines that one of the digital codes has changed, it creates an event signal (for example, an event signal input to arbiter 102). In response to the event signal indicating that one of the digital codes has changed, reference voltage generator 100 can enter an asynchronous mode (for example, in response to arbiter 102 providing a request signal to controller 104) and the reference voltage can be changed on the voltage rail corresponding to the digital code that has changed. This change of the reference voltage for the rail associated with the digital code that changed can be serviced immediately rather than waiting for controller to cycle through the rails and get to that rail in the synchronous mode. In some embodiments, the monitoring of the digital codes can be implemented by controller 104. In some embodiments, controller 104 can then control generator 100 to enter an asynchronous mode and perform the voltage change. In some embodiments, some or all of the functionality of the monitoring device can be implemented in hardware, in software, or in a combination of hardware and software.

Figure 2:
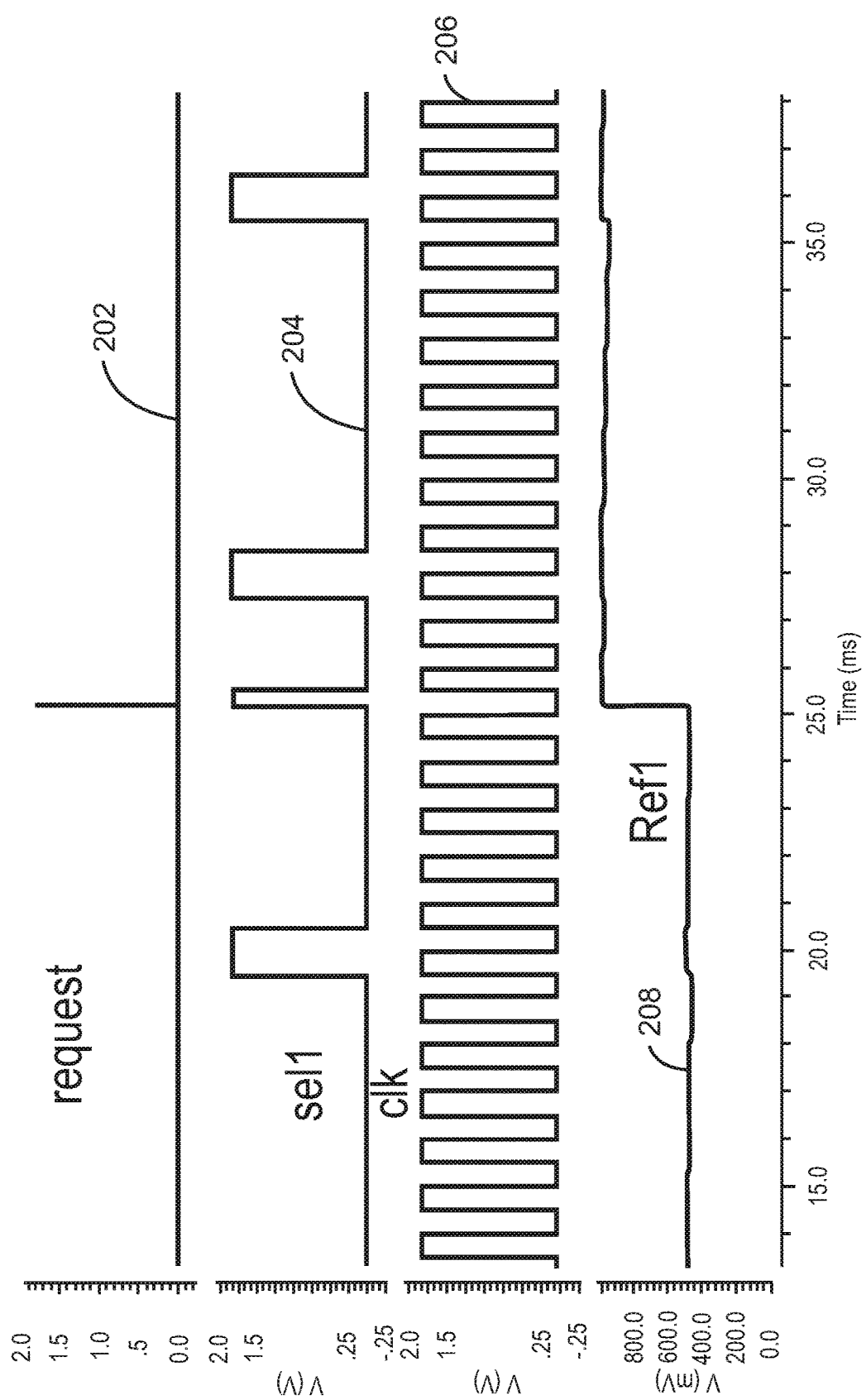
FIG. 2 illustrates reference voltage generator timing diagrams.

FIG. 2 illustrates example timing diagram waveforms 200 for a voltage reference generator in accordance with some embodiments. In some embodiments, waveforms 200 are illustrated as waveforms for an eight output voltage reference generator. For example, in some embodiments, FIG. 2 illustrates timing diagram waveforms 200 for a reference voltage generator 100 that includes eight codes ($Code_1$, $Code_2$, $Code_3$, $Code_4$, $Code_5$, $Code_6$, $Code_7$, $Code_8$), eight select lines ($sel_1$, $sel_2$, $sel_3$, $sel_4$, $sel_5$, $sel_6$, $sel_7$, $sel_8$), eight switches 112 and eight voltage rails 122. Waveforms 200 in FIG. 2 illustrate one voltage rail (rail #1) for simplicity sake. Waveforms 200 illustrated in FIG. 2 include request signal 202, select line $sel_1$ 204, clock signal clk 206, and voltage rail 1 voltage $Ref_1$ 208. Voltage reference generation waveforms 200 begin at the left side of FIG. 2 in a synchronous mode of the voltage reference generator in which rail 1 is maintained by sampling the output using select signal ($sel_1$) every eighth clock cycle along with all other rails sampling the output using their respective select signals during other clock cycles.

At approximately time 25.0 to 25.2 ms in FIG. 2, an event is detected from an increase in voltage of the request signal 202 and an increase in the voltage code $Code_1$ (not illustrated in FIG. 2), representing a need to change the voltage $Ref_1$ on voltage rail 1. As a result, the reference voltage generator responds immediately in an asynchronous mode by selecting the affected rail 1 using select signal $sel_1$ 204 and sampling the output of voltage rail 1 by increasing voltage $Ref_1$ 208 with the new voltage identified by the voltage code (for example, in FIG. 2, increasing the voltage $Ref_1$ 208 from a reference voltage around 0.5 volts to a reference voltage around 1 volt. Without asynchronous operation in response to the event request, the reference voltage generator would have had to wait several milliseconds and a few clock cycles before the new reference voltage $Ref_1$ 208 would have been changed in synchronous mode. This can result in system efficiency and speed, since any system elements that need the increased voltage will be able to receive that voltage from rail 1 immediately rather than waiting for several milliseconds during synchronous mode. Normal synchronous operation of the reference generator is then resumed and the new reference voltage $Ref_1$ is then maintained at its new value.

In some embodiments, by implementing reference voltage generation by combining a high speed asynchronous mode with a slow synchronous mode can allow for low power and small required circuit size. In some embodiments, this combination of synchronous and asynchronous modes for reference voltage generation can be implemented without any significant increase in power consumption, for example. Additionally, it can be implemented without a large real estate footprint for the components necessary to implement the solution (for example, because it may be implemented using a single digital-to-analog converter).

Figure 3:
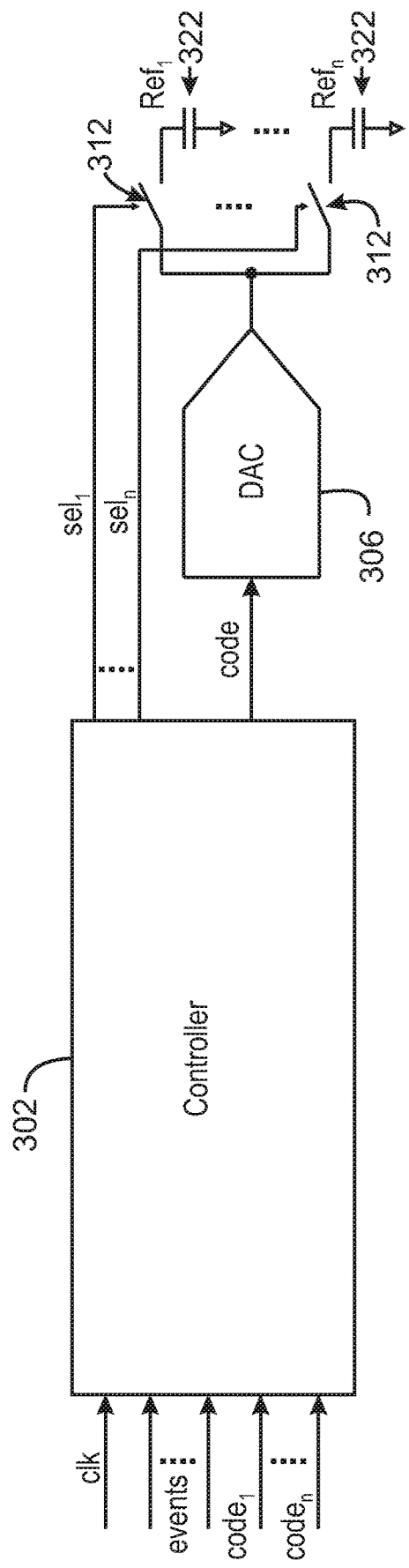
FIG. 3 illustrates a reference voltage generator.

FIG. 3 illustrates a reference voltage generator 300 in accordance with some embodiments. Reference voltage generator 300 includes a controller 302, a digital-to-analog converter (DAC) 306, a plurality of switches 312, and a plurality of voltage rails 322 each including a capacitor that can be used to hold a plurality of n different reference voltages $Ref_1$, $Ref_2$, ... $Ref_n$. In some embodiments, reference voltage generator 300 can include similar features as some of the features of voltage reference generator 100 of FIG. 1. In some embodiments, controller 302 includes functionality of both arbiter 102 and controller 104 of FIG. 1. That is, FIG. 3 illustrates a reference voltage generator 300 with combined arbitration and control functionality in accordance with some embodiments.

Figure 4:
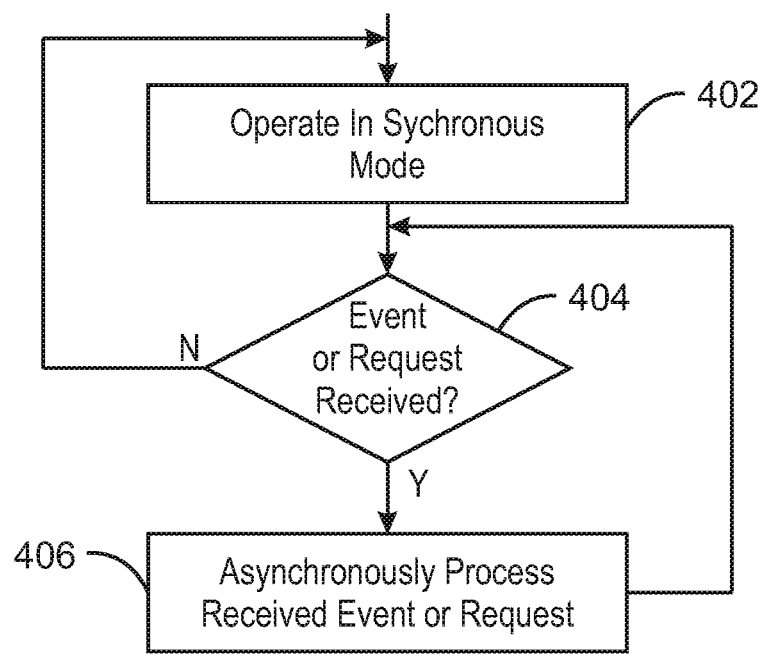
FIG. 4 illustrates reference voltage generation.

FIG. 4 illustrates reference voltage generation 400 in accordance with some embodiments. For example, in some embodiments, reference voltage generation 400 can be implemented by arbiter 102, by controller 104, or by controller 302. Reference voltage generation 400 includes operating in a synchronous mode in box 402. For example, the synchronous mode 402 can be implemented by cycling through reference voltage rails at a slow rate to maintain reference voltage outputs on a number of reference voltage rails. At box 404, a determination is made as to whether an asynchronous event or request relating to one of the reference voltage rails has been received. For example, box 404 can determine if the reference voltage provided by any of the reference voltage rails needs to be changed in response to some sort of event or request. If no event or request has been received at 404, flow returns to box 402 and the reference voltage generation remains in synchronous mode. If a determination is made at box 404 that an event or request relating to one of the reference voltage rails has been received, then an asynchronous mode of the reference voltage generation is entered at 406, and the received event or request is processed quickly in the asynchronous mode. Flow then returns to 404 to determine whether another event or request has been received, and all events/requests are processed asynchronously until flow returns to the synchronous mode at 402.

Figure 5:
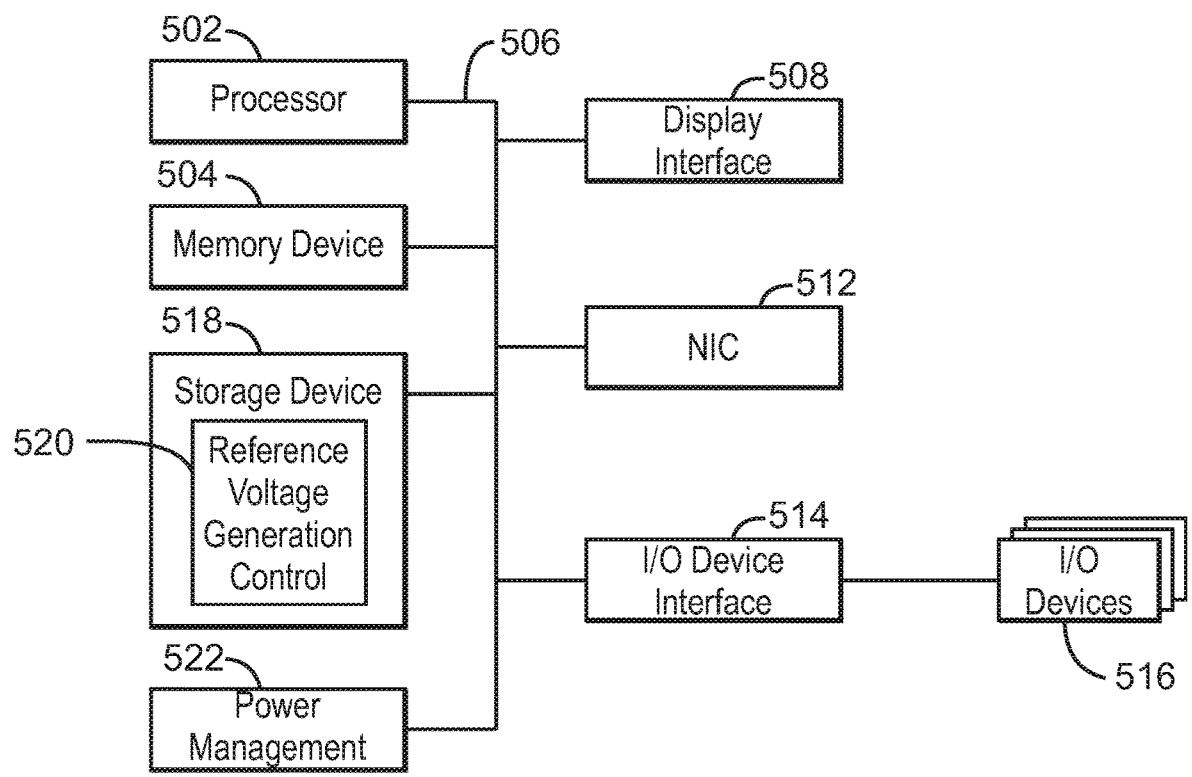
FIG. 5 illustrates a system including reference voltage generation.

FIG. 5 is a block diagram of an example of a computing device 500 that can include, for example, power generation, voltage generation, reference voltage generation, reference voltage generation control, and/or reference voltage arbitration, etc., according to some embodiments. In some embodiments, any portion of the circuits or systems illustrated in any one or more of the figures, and any of the embodiments described herein can be included in or be implemented by computing device 500. The computing device 500 may be, for example, a net-zero energy computing device, a portable device, a wearable device, an internet of things (IoT) device, a mobile phone, mobile device, handset, laptop computer, desktop computer, or tablet computer, among others. The computing device 500 may include a processor 502 that is adapted to execute stored instructions, as well as a memory device 504 (or storage device 504) that stores instructions that are executable by the processor 502. The processor 502 can be a single core processor, a multi-core processor, a computing cluster, or any number of other configurations. For example, processor 502 can be an Intel® processor such as an Intel® Celeron, Pentium, Core, Core i3, Core i5, or Core i7 processor. In some embodiments, processor 502 can be an Intel® x86 based processor. In some embodiments, processor 502 can be an ARM based processor. The memory device 504 can be a memory device or a storage device, and can include volatile storage, non-volatile storage, random access memory, read only memory, flash memory, or any other suitable memory or storage systems. The instructions that are executed by the processor 502 may also be used to implement power generation, voltage generation, reference voltage generation, reference voltage generation control, or reference voltage arbitration, etc. as described in this specification.

The processor 502 may also be linked through the system interconnect 506 (e.g., PCI®, PCI-Express®, NuBus, etc.) to a display interface 508 adapted to connect the computing device 500 to a display device. The display device (not shown) may include a display screen that is a built-in component of the computing device 500. The display device may also include a computer monitor, television, or projector, among others, that is externally connected to the computing device 500. In some embodiments, computing device 500 does not include a display interface or a display device.

In some embodiments, the display interface 508 can include any suitable graphics processing unit, transmitter, port, physical interconnect, and the like. In some examples, the display interface 508 can implement any suitable protocol for transmitting data to the display device. For example, the display interface 508 can transmit data using a high-definition multimedia interface (HDMI) protocol, a DisplayPort protocol, or some other protocol or communication link, and the like In addition, a network interface controller (also referred to herein as a NIC) 512 may be adapted to connect the computing device 500 through the system interconnect 506 to a network (not depicted). The network (not depicted) may be a cellular network, a radio network, a wide area network (WAN), a local area network (LAN), or the Internet, among others.

The processor 502 may be connected through system interconnect 506 to an input/output (I/O) device interface 514 adapted to connect the computing host device 500 to one or more I/O devices 516. The I/O devices 516 may include, for example, a keyboard or a pointing device, where the pointing device may include a touchpad or a touchscreen, among others. The I/O devices 516 may be built-in components of the computing device 500, or may be devices that are externally connected to the computing device 500.

In some embodiments, the processor 502 may also be linked through the system interconnect 506 to a storage device 518 that can include a hard drive, a solid-state drive (SSD), a magnetic drive, an optical drive, a USB flash drive, an array of drives, or any other type of storage, including combinations thereof. In some embodiments, the storage device 518 can include any suitable applications. In some embodiments, the storage device 518 can include reference voltage generation control 520, which can include reference voltage generation control, reference voltage generation arbitration, or any other functionality described herein.

In some embodiments, power management 522 (for example providing charging, power, power supply, power delivery, power management, power control, voltage regulation, power generation, voltage generation, reference voltage generation, reference voltage generation control, or reference voltage arbitration, etc., for example) is provided. In some embodiments, power management 522 can be a part of system 500, and in some embodiments, power management 522 can be external to the rest of system 500. In some embodiments, power management 522 can be included in a power management integrated circuit (IC). In some embodiments, power management 522 can be implemented in hardware, in software, or in a combination of hardware and software. In some embodiments, power management 522 can provide any of the power generation, voltage generation, reference voltage generation, reference voltage generation control, or reference voltage arbitration, etc., or related techniques described herein. For example, in some embodiments, power management 522 can provide power generation, voltage generation, reference voltage generation, reference voltage generation control, or reference voltage arbitration, etc. as described in reference to or illustrated in any of the drawings herein. In some embodiments, for example, power management 522 includes one or more elements of FIG. 1, FIG. 2, FIG. 3, or FIG. 4, or one or more features described in reference to FIG. 1, FIG. 2, FIG. 3, or FIG. 4. In some embodiments, power management 522 includes some of all features of reference voltage generator 100. In some embodiments, power management 522 includes some of all features of reference voltage generator 300. In some embodiments, power management 522 includes some of all features of reference voltage generation 400.

It is to be understood that the block diagram of FIG. 5 is not intended to indicate that the computing device 500 is to include all of the components shown in FIG. 5 in all embodiments. Rather, the computing device 500 can include fewer or additional components not illustrated in FIG. 5 (e.g., additional memory components, embedded controllers, additional modules, additional network interfaces, etc.). Furthermore, any of the functionalities of power device 522 may be partially, or entirely, implemented in hardware or in a processor such as processor 502. For example, the functionality may be implemented with an application specific integrated circuit, logic implemented in an embedded controller, or in logic implemented in the processor 502, among others. In some embodiments, the functionalities of power management 522 can be implemented with logic, wherein the logic, as referred to herein, can include any suitable hardware (e.g., a processor, among others), software (e.g., an application, among others), firmware, or any suitable combination of hardware, software, or firmware.

Figure 6:
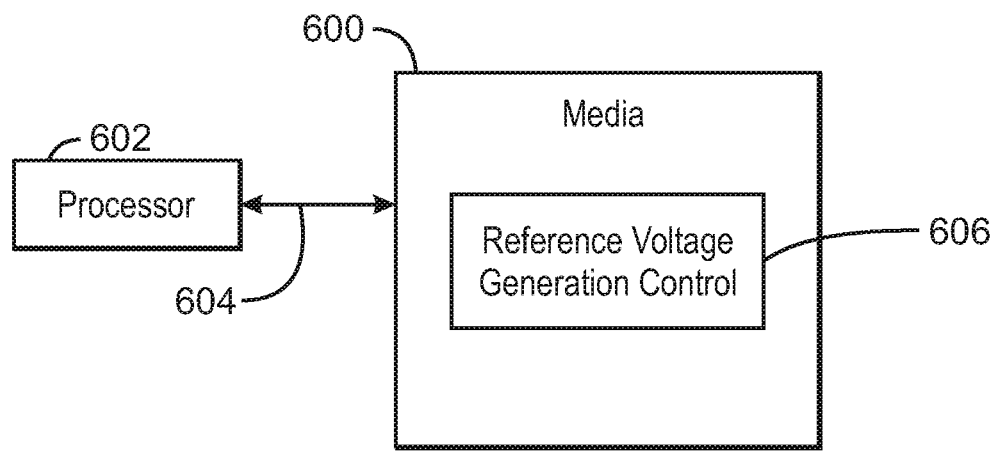
FIG. 6 illustrates one or more processors and one or more media.

FIG. 6 is a block diagram of an example of one or more processors 602 and one or more tangible, non-transitory computer readable media 600 for power generation, voltage generation, reference voltage generation, reference voltage generation control, or reference voltage arbitration, etc. The one or more tangible, non-transitory, computer-readable media 600 may be accessed by the processor(s) 602 over a computer interconnect 604. Furthermore, the one or more tangible, non-transitory, computer-readable media 600 may include computing code 606 or instructions 606 to direct the processor(s) 602 to perform operations as described herein. In some embodiments, processor 602 is one or more processors. In some embodiments, processor(s) 602 can perform some or all of the same functions (for example, by processing code 606 or instructions 606) that can be performed by other elements described herein using instructions (code) included on media 600 (for example, some or all of the functions illustrated in or described in reference to any of FIG. 1, FIG. 2, FIG. 3, FIG. 4 or FIG. 5).

Various components discussed in this specification may be implemented using software components. These software components may be stored on the one or more tangible, non-transitory, computer-readable media 600, as indicated in FIG. 6. For example, reference voltage generation code 606 or reference voltage generation instructions 606 (for example, power generation, voltage generation, reference voltage generation, reference voltage generation control, or reference voltage arbitration, etc.) may be adapted to direct the processor(s) 602 to perform one or more of any of the operations described in this specification and/or in reference to the drawings.

It is to be understood that any suitable number of software components may be included within the one or more tangible, non-transitory computer-readable media 600. Furthermore, any number of additional software components shown or not shown in FIG. 6 may be included within the one or more tangible, non-transitory, computer-readable media 600, depending on the specific application.

Reference in the specification to "one embodiment" or "an embodiment" or "some embodiments" of the disclosed subject matter means that a particular feature, structure, or characteristic described in connection with the embodiment is included in at least one embodiment of the disclosed subject matter. Thus, the phrase "in one embodiment" or "in some embodiments" may appear in various places throughout the specification, but the phrase may not necessarily refer to the same embodiment or embodiments.

Example 1 includes an apparatus for reference voltage generation. The apparatus includes a plurality of reference voltage rails each with a corresponding reference voltage, a first controller to cycle through the plurality of reference voltage rails and maintain the reference voltages in a synchronous mode, and a second controller to detect an event and provide an indication to the first controller to update in an asynchronous mode one of the plurality of reference voltages in response to the event. The first controller is to update in an asynchronous mode the one of the plurality of reference voltages in response to the event.

Example 2 includes the apparatus of example 1. In example 2, the first controller and the second controller are included in one controller.

Example 3 includes the apparatus of any of examples 1 to 2. In example 3, the first controller is to delay application of a voltage to any other reference voltages other than the updated one of the plurality of reference voltages during the update in response to an input from the second controller.

Example 4 includes the apparatus of any of examples 1 to 3. In example 4, the second controller is to detect a second event, and is to arbitrate updating of two of the plurality of reference voltages in response to the detected event and the detected second event.

Example 5 includes the apparatus of any of examples 1 to 4. In some examples, the apparatus of example 5 includes a digital-to-analog converter. The first controller is to provide a digital voltage code to the digital-to-analog converter, the digital-to-analog converter is to provide an analog voltage corresponding to the digital voltage code, and the first controller is to enable provision of the analog voltage to one of the reference voltage rails corresponding to the digital voltage code.

Example 6 includes the apparatus of any of examples 1 to 5. In example 6, each of the reference voltage rails includes a capacitor to hold the corresponding reference voltage.

Example 7 includes the apparatus of any of examples 1 to 6. In some examples, the apparatus of example 7 includes a monitor (or a controller) to monitor a plurality of digital voltage codes corresponding to the reference voltages and to provide an event indication to the second controller in response to a change in one of the digital voltage codes.

Example 8 includes the apparatus of any of examples 1 to 7. In example 8, the first controller is to return to the synchronous mode and to cycle through the plurality of reference voltage rails and maintain the reference voltages in a synchronous mode after updating the one of the plurality of reference voltages.

Example 9 includes a method of reference voltage generation. In example 9, the method includes cycling through a plurality of reference voltage rails each with a corresponding reference voltage, the cycling to maintain the reference voltages in a synchronous mode, detecting an event relating to a request to update in an asynchronous mode one of the plurality of reference voltages, and updating in an asynchronous mode the one of the plurality of reference voltages in response to the detected event.

Example 10 includes the method of example 9. In example 10, the method includes delaying application of a voltage to any reference voltages other than the updated one of the plurality of reference voltages during the update.

Example 11 includes the method of any of examples 9 to 10. In example 11, the method includes delaying application of a voltage to any reference voltages other than the updated one of the plurality of reference voltages for a predetermined period of time.

Example 12 includes the method of any of examples 9 to 11. In example 12, the method includes detecting a second event, and arbitrating updating of two of the plurality of reference voltages in response to the detected event and the detected second event.

Example 13 includes the method of any of examples 9 to 12. In example 13, the method includes converting a digital voltage code to an analog voltage corresponding to the digital voltage code, and enabling provision of the analog voltage to one of the reference voltage rails corresponding to the digital voltage code.

Example 14 includes the method of any of examples 9 to 13. In example 14, the method includes holding each of the reference voltages in a corresponding capacitor.

Example 15 includes the method of any of examples 9 to 14. In example 15, the method includes monitoring a plurality of digital voltage codes corresponding to the reference voltages, and providing an event indication in response to a change in one of the digital voltage codes.

Example 16 includes the method of any of examples 9 to 15. In example 16, the method includes returning from the asynchronous mode to the synchronous mode after updating the one of the plurality of reference voltages, and cycling through the plurality of reference voltage rails to maintain the reference voltages after returning to the synchronous mode.

Example 17 includes a non-transitory, machine readable medium. The non-transitory, machine readable medium includes instructions that, when executed, direct a processor to cycle through a plurality of reference voltage rails each with a corresponding reference voltage, the cycling to maintain the reference voltages in a synchronous mode, to detect an event relating to a request to update in an asynchronous mode one of the plurality of reference voltages, and to update in an asynchronous mode the one of the plurality of reference voltages in response to the detected event.

Example 18 includes the non-transitory, machine readable medium of example 17. In example 18, the non-transitory, machine readable medium includes instructions that, when executed, direct a processor to delay application of a voltage to any other reference voltages other than the updated one of the plurality of reference voltages during the update.

Example 19 includes the non-transitory, machine readable medium of any of examples 17 to 18. In example 19, the non-transitory, machine readable medium includes instructions that, when executed, direct a processor to delay application of a voltage to any other reference voltages other than the updated one of the plurality of reference voltages for a predetermined period of time.

Example 20 includes the non-transitory, machine readable medium of any of examples 17 to 19. In example 20, the non-transitory, machine readable medium includes instructions that, when executed, direct a processor to detect a second event, and to arbitrate updating of two of the plurality of reference voltages in response to the detected event and the detected second event.

Example 21 includes the non-transitory, machine readable medium of any of examples 17 to 20. In example 21, the non-transitory, machine readable medium includes instructions that, when executed, direct a processor to convert a digital voltage code to an analog voltage corresponding to the digital voltage code, and enable provision of the analog voltage to one of the reference voltage rails corresponding to the digital voltage code.

Example 22 includes the non-transitory, machine readable medium of any of examples 17 to 21. In example 22, the non-transitory, machine readable medium includes instructions that, when executed, direct a processor to hold each of the reference voltages in a corresponding capacitor.

Example 23 includes the non-transitory, machine readable medium of any of examples 17 to 22. In example 23, the non-transitory, machine readable medium includes instructions that, when executed, direct a processor to monitor a plurality of digital voltage codes corresponding to the reference voltages, and provide an event indication in response to a change in one of the digital voltage codes.

Example 24 includes the non-transitory, machine readable medium of any of examples 17 to 23. In example 24, the non-transitory, machine readable medium includes instructions that, when executed, direct a processor to return from the asynchronous mode to the synchronous mode after updating the one of the plurality of reference voltages, and cycle through the plurality of reference voltage rails to maintain the reference voltages after returning to the synchronous mode.

Example 25 includes an apparatus for reference voltage generation. The apparatus includes means for cycling through a plurality of reference voltage rails each with a corresponding reference voltage, the means for cycling to maintain the reference voltages in a synchronous mode, means for detecting an event relating to a request to update in an asynchronous mode one of the plurality of reference voltages, and means for updating in an asynchronous mode the one of the plurality of reference voltages in response to the detected event.

Example 26 includes the apparatus of example 25. In example 25, the apparatus includes means for delaying application of a voltage to any other reference voltages other than the updated one of the plurality of reference voltages during the update.

Example 27 includes the apparatus of any of examples 25 to 26. In example 27, the apparatus includes means for delaying application of a voltage to any other reference voltages other than the updated one of the plurality of reference voltages for a predetermined period of time.

Example 28 includes the apparatus of any of examples 25 to 27. In example 28, the apparatus includes means for detecting a second event, and means for arbitrating updating of two of the plurality of reference voltages in response to the detected event and the detected second event.

Example 29 includes the apparatus of any of examples 25 to 28. In example 29, the apparatus includes means for converting a digital voltage code to an analog voltage corresponding to the digital voltage code, and means for enabling provision of the analog voltage to one of the reference voltage rails corresponding to the digital voltage code.

Example 30 includes the apparatus of any of examples 25 to 29. In example 30, the apparatus includes means for holding each of the reference voltages.

Example 31 includes the apparatus of any of examples 25 to 30. In example 31, the apparatus includes means for monitoring a plurality of digital voltage codes corresponding to the reference voltages, and means for providing an event indication in response to a change in one of the digital voltage codes.

Example 32 includes the apparatus of any of examples 25 to 31. In example 32, the apparatus includes means for returning from the asynchronous mode to the synchronous mode after updating the one of the plurality of reference voltages, and means for cycling through the plurality of reference voltage rails to maintain the reference voltages after returning to the synchronous mode.

Example 33 includes a computing system. The computing system includes a processor, storage to store instructions to be executed by the processor, and a reference voltage generation system. The reference voltage generation system includes a plurality of reference voltage rails each with a corresponding reference voltage, a first controller to cycle through the plurality of reference voltage rails and maintain the reference voltages in a synchronous mode, and a second controller to detect an event and provide an indication to the first controller to update in an asynchronous mode one of the plurality of reference voltages in response to the event. The first controller is to update in an asynchronous mode the one of the plurality of reference voltages in response to the event.

Example 34 includes the system of example 33. In example 34, the first controller and the second controller are included in one controller.

Example 35 includes the system of any of examples 33 to 34. In example 35, the first controller is to delay application of a voltage to any other reference voltages other than the updated one of the plurality of reference voltages during the update in response to the second controller.

Example 36 includes the system of any of examples 33 to 35. In example 36, the second controller is to detect a second event, and is to arbitrate updating of two of the plurality of reference voltages in response to the detected event and the detected second event.

Example 37 includes the system of any of examples 33 to 36. In example 37, the reference voltage generation system includes a digital-to-analog converter. The first controller is to provide a digital voltage code to the digital-to-analog converter, the digital-to-analog converter is to provide an analog voltage corresponding to the digital voltage code, and the first controller is to enable provision of the analog voltage to one of the reference voltage rails corresponding to the digital voltage code.

Example 38 includes the system of any of examples 33 to 37. In example 38, each of the reference voltage rails includes a capacitor to hold the corresponding reference voltage.

Example 39 includes the system of any of examples 33 to 38. In example 39, the reference voltage generation system includes a monitor to monitor a plurality of digital voltage codes corresponding to the reference voltages and to provide an event indication to the second controller in response to a change in one of the digital voltage codes.

Example 40 includes the system of any of examples 33 to 39. In example 40, the first controller is to return to the synchronous mode and to cycle through the plurality of reference voltage rails and maintain the reference voltages in a synchronous mode after updating the one of the plurality of reference voltages.

Example 41 includes a machine readable medium including code, when executed, to cause a machine to perform the method of any of the other examples.

Example 42 includes an apparatus including means to perform a method or realize an apparatus as in any other example.

Example 43 includes machine-readable storage including machine-readable instructions, when executed to implement a method or realize an apparatus as in any other example.

Although example embodiments of the disclosed subject matter are described with reference to circuit diagrams, flow diagrams, block diagrams etc. in the drawings, persons of ordinary skill in the art will readily appreciate that many other ways of implementing the disclosed subject matter may alternatively be used. For example, the arrangements of the elements in the diagrams, or the order of execution of the blocks in the diagrams may be changed, or some of the circuit elements in circuit diagrams, and blocks in block/flow diagrams described may be changed, eliminated, or combined. Any elements as illustrated or described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

Program code may represent hardware using a hardware description language or another functional description language which essentially provides a model of how designed hardware is expected to perform. Program code may be assembly or machine language or hardware-definition languages, or data that may be compiled or interpreted. Furthermore, it is common in the art to speak of software, in one form or another as taking an action or causing a result. Such expressions are merely a shorthand way of stating execution of program code by a processing system which causes a processor to perform an action or produce a result.

Program code may be stored in, for example, one or more volatile or non-volatile memory devices, such as storage devices or an associated machine readable or machine accessible medium including solid-state memory, hard-drives, floppy-disks, optical storage, tapes, flash memory, memory sticks, digital video disks, digital versatile discs (DVDs), etc., as well as more exotic mediums such as machine-accessible biological state preserving storage. A machine readable medium may include any tangible mechanism for storing, transmitting, or receiving information in a form readable by a machine, such as antennas, optical fibers, communication interfaces, etc. Program code may be transmitted in the form of packets, serial data, parallel data, etc., and may be used in a compressed or encrypted format.

Program code may be implemented in programs executing on programmable machines such as mobile or stationary computers, personal digital assistants, set top boxes, cellular telephones and pagers, and other electronic devices, each including a processor, volatile or non-volatile memory readable by the processor, at least one input device or one or more output devices. Program code may be applied to the data entered using the input device to perform the described embodiments and to generate output information. The output information may be applied to one or more output devices. One of ordinary skill in the art may appreciate that embodiments of the disclosed subject matter can be practiced with various computer system configurations, including multiprocessor or multiple-core processor systems, minicomputers, mainframe computers, as well as pervasive or miniature computers or processors that may be embedded into virtually any device. Embodiments of the disclosed subject matter can also be practiced in distributed computing environments where tasks may be performed by remote processing devices that are linked through a communications network.

Although operations may be described as a sequential process, some of the operations may in fact be performed in parallel, concurrently, or in a distributed environment, and with program code stored locally or remotely for access by single or multi-processor machines. In addition, in some embodiments the order of operations may be rearranged without departing from the spirit of the disclosed subject matter. Program code may be used by or in conjunction with embedded controllers.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter. For example, in each illustrated embodiment and each described embodiment, it is to be understood that the diagrams of the figures and the description herein is not intended to indicate that the illustrated or described devices include all of the components shown in a particular figure or described in reference to a particular figure. In addition, each element may be implemented with logic, wherein the logic, as referred to herein, can include any suitable hardware (e.g., a processor, among others), software (e.g., an application, among others), firmware, or any suitable combination of hardware, software, and firmware, for example.

What is claimed is:

1. An apparatus for reference voltage generation, comprising:
   a plurality of reference voltage rails each with a corresponding reference voltage;
   a first controller to cycle through the plurality of reference voltage rails and maintain the reference voltages in a synchronous mode;
   a second controller to detect an event and provide an indication to the first controller to update in an asynchronous mode one of the plurality of reference voltages in response to the event, wherein the first controller is to update in an asynchronous mode the one of the plurality of reference voltages in response to the event; and
   a digital-to-analog converter, wherein the first controller is to provide a digital voltage code to the digital-to-analog converter, the digital-to-analog converter is to provide an analog voltage corresponding to the digital voltage code, and the first controller is to enable provision of the analog voltage to one of the reference voltage rails corresponding to the digital voltage code.

2. The apparatus of claim 1, wherein the first controller and the second controller are included in one controller.

3. The apparatus of claim 1, wherein the first controller is to delay application of a voltage to any other reference voltages other than the updated one of the plurality of reference voltages during the update in response to the second controller.

4. The apparatus of claim 1, wherein the second controller is to detect a second event, and is to arbitrate updating of two of the plurality of reference voltages in response to the detected event and the detected second event.

5. The apparatus of claim 1, wherein each of the reference voltage rails includes a capacitor to hold the corresponding reference voltage.

6. The apparatus of claim 1, comprising a monitor to monitor a plurality of digital voltage codes corresponding to the reference voltages and to provide an event indication to the second controller in response to a change in one of the digital voltage codes.

7. The apparatus of claim 1, wherein the first controller is to return to the synchronous mode and to cycle through the plurality of reference voltage rails and maintain the reference voltages in a synchronous mode after updating the one of the plurality of reference voltages.

8. A method of reference voltage generation, comprising:
   cycling through a plurality of reference voltage rails each with a corresponding reference voltage, the cycling to maintain the reference voltages in a synchronous mode;
   detecting an event relating to a request to update in an asynchronous mode one of the plurality of reference voltages;
   updating in an asynchronous mode the one of the plurality of reference voltages in response to the detected event;
   converting a digital voltage code to an analog voltage corresponding to the digital voltage code; and
   enabling provision of the analog voltage to one of the reference voltage rails corresponding to the digital voltage code.

9. The method of claim 8, comprising delaying application of a voltage to any other reference voltages other than the updated one of the plurality of reference voltages during the update.

10. The method of claim 8, comprising delaying application of a voltage to any other reference voltages other than the updated one of the plurality of reference voltages for a predetermined period of time.

11. The method of claim 8, comprising:
    detecting a second event; and
    arbitrating updating of two of the plurality of reference voltages in response to the detected event and the detected second event.

12. The method of claim 8, comprising holding each of the reference voltages in a corresponding capacitor.

13. The method of claim 8, comprising:
    monitoring a plurality of digital voltage codes corresponding to the reference voltages; and
    providing an event indication in response to a change in one of the digital voltage codes.

14. The method of claim 8, comprising:
    returning from the asynchronous mode to the synchronous mode after updating the one of the plurality of reference voltages; and
    cycling through the plurality of reference voltage rails to maintain the reference voltages after returning to the synchronous mode.

15. A non-transitory, machine readable medium comprising instructions that, when executed, direct a processor to:
    cycle through a plurality of reference voltage rails each with a corresponding reference voltage, the cycling to maintain the reference voltages in a synchronous mode;
    detect an event relating to a request to update in an asynchronous mode one of the plurality of reference voltages;
    update in an asynchronous mode the one of the plurality of reference voltages in response to the detected event;
    convert a digital voltage code to an analog voltage corresponding to the digital voltage code; and
    enable provision of the analog voltage to one of the reference voltage rails corresponding to the digital voltage code.

16. The non-transitory, machine readable medium of claim 15, comprising instructions that, when executed, direct a processor to:
    delay application of a voltage to any other reference voltages other than the updated one of the plurality of reference voltages during the update.

17. The non-transitory, machine readable medium of claim 15, comprising instructions that, when executed, direct a processor to:
    delay application of a voltage to any other reference voltages other than the updated one of the plurality of reference voltages for a predetermined period of time.

18. The non-transitory, machine readable medium of claim 15, comprising instructions that, when executed, direct a processor to:
    detect a second event; and
    arbitrate updating of two of the plurality of reference voltages in response to the detected event and the detected second event.

19. The non-transitory, machine readable medium of claim 15, comprising instructions that, when executed, direct a processor to:
hold each of the reference voltages in a corresponding capacitor.

20. The non-transitory, machine readable medium of claim 15, comprising instructions that, when executed, direct a processor to:
monitor a plurality of digital voltage codes corresponding to the reference voltages; and
provide an event indication in response to a change in one of the digital voltage codes.

21. The non-transitory, machine readable medium of claim 15, comprising instructions that, when executed, direct a processor to:
return from the asynchronous mode to the synchronous mode after updating the one of the plurality of reference voltages; and
cycle through the plurality of reference voltage rails to maintain the reference voltages after returning to the synchronous mode.

22. An apparatus for reference voltage generation, comprising:
a controller to provide a signal to select one of a plurality of reference voltage rails and to provide a digital voltage code corresponding to the one of the plurality of reference voltage rails; and
a digital-to-analog converter to receive the digital voltage code from the controller, and to provide an analog voltage corresponding to the digital voltage code, the controller to enable provision of the analog voltage to the one of the reference voltage rails.

23. The apparatus of claim 22, the controller to cycle through the plurality of reference voltage rails and maintain the reference voltages in a synchronous mode.

24. The apparatus of claim 23, comprising:
a second controller to detect an event and provide an indication to the controller to update in an asynchronous mode one of the plurality of reference voltages in response to the event;
wherein the controller is to update in an asynchronous mode the one of the plurality of reference voltages in response to the event.

25. The apparatus of claim 24, wherein the controller is to delay application of a voltage to any other reference voltages other than the updated one of the plurality of reference voltages during the update in response to the second controller.

26. The apparatus of claim 24, wherein the second controller is to detect a second event, and is to arbitrate updating of two of the plurality of reference voltages in response to the detected event and the detected second event.

27. The apparatus of claim 22, comprising a monitor to monitor a plurality of digital voltage codes corresponding to the reference voltages and to provide an event indication in response to a change in one of the digital voltage codes.

28. The apparatus of claim 24, wherein the controller is to return to the synchronous mode and to cycle through the plurality of reference voltage rails and maintain the reference voltages in a synchronous mode after updating the one of the plurality of reference voltages.

29. A method of reference voltage generation, comprising:
providing a signal to select one of a plurality of reference voltage rails;
providing to a digital-to-analog converter a digital voltage code corresponding to the one of the plurality of reference voltage rails; and
enabling provision to the one of the plurality of reference voltage rails an analog voltage converted from the digital voltage code by the digital-to-analog converter.

30. The method of claim 29, comprising converting the digital voltage code to the analog voltage.

31. The method of claim 29, comprising cycling through the plurality of reference voltage rails and maintaining the reference voltages in a synchronous mode.

32. The method of claim 31, comprising updating in an asynchronous mode the one of the plurality of reference voltages in response to an event.

33. The method of claim 32, comprising delaying application of a voltage to any other reference voltages other than the updated one of the plurality of reference voltages.

34. The method of claim 32, comprising arbitrating updating of two of the plurality of reference voltages in response to the event and a second event.

35. The method of claim 29, comprising:
monitoring a plurality of digital voltage codes corresponding to the reference voltages; and
providing an event indication in response to a change in one of the digital voltage codes.

36. The method of claim 32, comprising returning to the synchronous mode and cycling through the plurality of reference voltage rails and maintaining the reference voltages in the synchronous mode after updating the one of the plurality of reference voltages.

37. A non-transitory, machine readable medium comprising instructions that, when executed, direct a processor to:
provide a signal to select one of a plurality of reference voltage rails;
provide to a digital-to-analog converter a digital voltage code corresponding to the one of the plurality of reference voltage rails; and
enable provision to the one of the plurality of reference voltage rails an analog voltage converted from the digital voltage code by the digital-to-analog converter.

38. The non-transitory, machine readable medium of claim 37, comprising instructions that, when executed, direct a processor to convert the digital voltage code to the analog voltage.

39. The non-transitory, machine readable medium of claim 37, comprising instructions that, when executed, direct a processor to cycle through the plurality of reference voltage rails and maintain the reference voltages in a synchronous mode.

40. The non-transitory, machine readable medium of claim 39, comprising instructions that, when executed, direct a processor to update in an asynchronous mode the one of the plurality of reference voltages in response to an event.

41. The non-transitory, machine readable medium of claim 40, comprising instructions that, when executed, direct a processor to delay application of a voltage to any other reference voltages other than the updated one of the plurality of reference voltages.

42. The non-transitory, machine readable medium of claim 40, comprising instructions that, when executed, direct a processor to arbitrate updating of two of the plurality of reference voltages in response to the event and a second event.

43. The non-transitory, machine readable medium of claim 37, comprising instructions that, when executed, direct a processor to:
monitor a plurality of digital voltage codes corresponding to the reference voltages; and provide an event indication in response to a change in one of the digital voltage codes.

44. The non-transitory, machine readable medium of claim 40, comprising instructions that, when executed, direct a processor to return to the synchronous mode and cycle through the plurality of reference voltage rails and maintain the reference voltages in the synchronous mode after updating the one of the plurality of reference voltages.

* * * * *